United States Patent
Senda et al.

(10) Patent No.: US 6,875,629 B2
(45) Date of Patent: Apr. 5, 2005

(54) III GROUP NITRIDE BASED SEMICONDUCTOR ELEMENT AND METHOD FOR MANUFACTURE THEREOF

(75) Inventors: Masanobu Senda, Aichi (JP); Naoki Shibata, Aichi (JP); Jun Ito, Aichi (JP); Toshiaki Chiyo, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/479,590

(22) PCT Filed: Jun. 3, 2002

(86) PCT No.: PCT/JP02/05429

§ 371 (c)(1),
(2), (4) Date: Dec. 4, 2003

(87) PCT Pub. No.: WO02/101840

PCT Pub. Date: Dec. 19, 2002

(65) Prior Publication Data

US 2004/0209390 A1 Oct. 21, 2004

(30) Foreign Application Priority Data

Jun. 6, 2001 (JP) .................................... 2001-170910

(51) Int. Cl.$^7$ ............................................. H01L 21/00
(52) U.S. Cl. ............................. 438/46; 438/20; 438/22; 438/40; 438/43; 438/478; 438/606; 257/10; 257/13; 257/79; 257/292; 257/293; 257/918
(58) Field of Search ........................ 438/20–49, 149, 438/478, 606; 257/9–21, 86, 184, 290–295

(56) References Cited

U.S. PATENT DOCUMENTS

| | | | | |
|---|---|---|---|---|
| 5,115,286 A | * | 5/1992 | Camras et al. ............... 257/94 |
| 5,204,302 A | * | 4/1993 | Gorynin et al. ............... 502/2 |
| 5,223,374 A | * | 6/1993 | Mohr et al. ................ 430/257 |
| 5,545,291 A | * | 8/1996 | Smith et al. ................ 438/107 |
| 6,045,626 A | * | 4/2000 | Yano et al. ................ 148/33.4 |
| 6,342,404 B1 | * | 1/2002 | Shibata et al. ............... 438/46 |
| 6,423,990 B1 | * | 7/2002 | El-Sharawy et al. ........ 257/197 |
| 6,426,512 B1 | * | 7/2002 | Ito et al. ....................... 257/12 |
| 6,531,719 B2 | * | 3/2003 | Shibata et al. ............... 257/190 |
| 6,579,573 B2 | * | 6/2003 | Strutt et al. ................ 427/452 |

(Continued)

FOREIGN PATENT DOCUMENTS

| | | | | |
|---|---|---|---|---|
| JP | 56-042390 | * | 9/1979 | .......... H01L/33/00 |
| JP | 2-277763 | | 11/1990 | |
| JP | 3-55886 | | 3/1991 | |
| JP | 7-165498 | | 6/1995 | |
| JP | 7-202265 | | 8/1995 | |
| JP | 9-237938 | | 9/1997 | |
| JP | 10-312971 | | 11/1998 | |

(Continued)

OTHER PUBLICATIONS

Panda et al. "Low temperature chemical vapor deposition of titanium nitride films from tetrakis–titanium and ammonia" Thin solid films vol. 357 1999 p. 125–131.*

(Continued)

*Primary Examiner*—Matthew Smith
*Assistant Examiner*—Granvill D. Lee, Jr.
(74) *Attorney, Agent, or Firm*—McGinn & Gibb, PLLC

(57) ABSTRACT

A separator layer of Ti is formed on an auxiliary substrate of sapphire or the like. An undercoat layer of TiN is formed on the separator layer. The undercoat layer is provided so that a Group III nitride compound semiconductor layer can be grown with good crystallinity on the undercoat layer. TiN is sprayed on the undercoat layer to form a thermal spray depositing layer. Then, the separator layer is chemically etched to reveal the undercoat layer. Then, a Group III nitride compound semiconductor layer is grown on a surface of the undercoat layer.

11 Claims, 3 Drawing Sheets

U.S. PATENT DOCUMENTS

| | | | |
|---|---|---|---|
| 6,590,229 B1 * | 7/2003 | Yamazaki et al. | 257/71 |
| 6,593,016 B1 * | 7/2003 | Chiyo et al. | 428/698 |
| 6,623,998 B2 * | 9/2003 | Shibata et al. | 438/22 |
| 2002/0036055 A1 * | 3/2002 | Yoshimura et al. | 156/234 |
| 2003/0134488 A1 * | 7/2003 | Yamazaki et al. | 438/455 |

FOREIGN PATENT DOCUMENTS

| | | | |
|---|---|---|---|
| JP | 2000-216090 | | 8/2000 |
| JP | 2000-323753 | | 11/2000 |
| JP | 2003-243308 | * 2/2002 | H01L/21/205 |
| JP | 2002-368264 | | 12/2002 |
| WO | WO 96/26006 | * 8/1996 | B01J/37/34 |

OTHER PUBLICATIONS

Akira Kobayashi, et al., "Formation of TiN Coating by Gas Tunnel Type Plasma Reactive Spraying", *National Meeting of Japan Welding Society*, No. 65, Nov. 1999, pp. 410–411.

Masahiro Fukumoto, et al., "Fabrication of functionally gradient TiN coatings by reactive plasma spraying", *Quarterly Journal of Japan Welding Society*, vol. 14, No. 2, pp. 443–448 (1996).

* cited by examiner

III GROUP NITRIDE BASED SEMICONDUCTOR ELEMENT AND METHOD FOR MANUFACTURE THEREOF

TECHNICAL FIELD

The present invention relates to a Group III nitride compound semiconductor device and a method for producing the same.

BACKGROUND ART

Unexamined Japanese Patent Publication No. Hei-9-237938 has disclosed the fact that a (111) face of metal nitride having a rock salt structure as an undercoat layer is used as a substrate in order to obtain Group III nitride compound semiconductor layers good in crystallinity. That is, in this official gazette, metal nitride having a rock salt structure is used as a substrate so that Group III nitride compound semiconductor layers are grown on a (111) face of the substrate.

Characteristic (such as stiffness, impact resistance, etc.) for retaining the function of a semiconductor device is required of the substrate of the device. It is conceived that the substrate needs a thickness, for example, of not smaller than 50 $\mu$m in order to retain the characteristic when the substrate is made of metal nitride.

Metal nitride having such a thickness, however, has been not provided as a raw material of an industrial product used for producing a semiconductor.

Therefore, an object of the invention is to be capable of forming a Group III nitride compound semiconductor layer having a good crystallographic structure by using an industrially easily available raw material. Accordingly, a semiconductor device according to the invention has a semiconductor layer of a good crystallographic structure and can be produced inexpensively.

From a different point of view, another object of the invention is to provide a Group III nitride compound semiconductor device having a novel substrate and a method for producing the same.

DISCLOSURE OF THE INVENTION

The present inventors have made research continuously and eagerly to achieve at least one of the foregoing objects. As a result, the inventors have thought the following invention out.

That is, according to the invention, there is provided a method of producing a Group III nitride compound semiconductor device, including the steps of: forming a separator layer on an auxiliary substrate; forming an undercoat layer on the separator layer; forming a thermal spray depositing layer on the undercoat layer; separating the separator layer from the undercoat layer; and forming a Group III nitride compound on a surface of the undercoat layer opposite to a surface on which the thermal spray depositing layer is formed.

According to the semiconductor device of the invention configured as described above, the undercoat layer is formed on the auxiliary substrate through the separator layer. A material for forming the undercoat layer can be selected so that the Group III nitride compound semiconductor layer can be grown with good crystallinity on the undercoat layer. The thermal spray depositing layer is formed on the undercoat layer. By spray coating, a thick layer having sufficient stiffness can be easily formed as a substrate. The separator layer is separated from the undercoat layer to reveal the undercoat layer. Then, the thermal spray depositing layer is used as a substrate so that the Group III nitride compound semiconductor layer can be formed on a surface of the undercoat layer.

As described above, the Group III nitride compound semiconductor layer is grown on the undercoat layer to form a device structure. Accordingly, the undercoat layer has a structure preferably used for growing a Group III nitride compound semiconductor.

BEST MODE FOR CARRYING OUT THE INVENTION

Figure 1A:
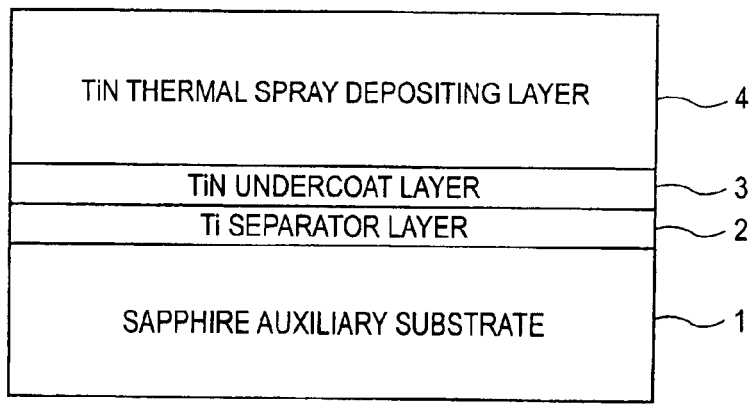
FIG. 1 is a view showing a method for producing a light-emitting diode according to an embodiment of the invention.

The invention will be described below in detail.

In the invention, a Group III nitride compound semiconductor layer is grown on an undercoat layer, so that a device structure such as a light-emitting diode is constructed by the Group III nitride compound semiconductor layer. Therefore, the undercoat layer needs to have a crystallographic structure suitable for growth of a Group III nitride compound semiconductor. Therefore, an auxiliary substrate and a separator layer supporting the undercoat layer are selected to be suitable for formation of the undercoat layer.

From the aforementioned point of view, the respective layers, that is, the auxiliary substrate, the separator layer and the undercoat layer will be described below.

Auxiliary Substrate

A hexagonal crystal material such as sapphire, SiC (silicon carbide), GaN (galliumnitride), etc. or a cubiccrystal material such as Si (silicon), GaP (gallium phosphide), GaAs (gallium arsenide), etc. can be used as the auxiliary substrate. In the case of a hexagonal crystal material, the undercoat layer is grown on the hexagonal crystal material. In the case of a cubic crystal material, a (111) face of the cubic crystal material is used.

Separator Layer

The separator layer is to be separated from the undercoat layer later. Preferably, Ti is used as the separator layer. Another material such as ZnO may be also used.

The titanium layer is formed on the substrate by a method such as a DC sputtering method, an ion-plating method, a spray thermal decomposition method, or the like. The film thickness of the titanium layer is not particularly limited but may be selected to be preferably in a range of from 0.1 $\mu$m to 10 $\mu$m, more preferably in a range of from 0.1 $\mu$m to 5 $\mu$m, most preferably in a range of from 0.2 $\mu$m to 3 $\mu$m.

The titanium layer can be chemically etched with acid (such as aqua regia, etc.). As a result, the auxiliary substrate is separated from the undercoat layer. If a thermal spray depositing layer and the undercoat layer are made electrically conductive, these can be used as electrodes. Therefore, only one electrode needs to be formed on the Group III nitride compound semiconductor layer side.

Undercoat Layer

Nitride of one kind of metal or two or more kinds of metal selected from the group consisting of titanium, hafnium, zirconium and tantalum and having a rock salt structure is used as the material of the undercoat layer. Especially, titanium nitride is preferred. Such metal nitride is very low in lattice misfit to Group III nitride compound semiconductor formed on the metal nitride. The metal nitride can be formed with good crystallinity on the titanium layer while the titanium layer can be formed with good crystallinity on the substrate of sapphire or the like. On the other hand, because a thickness required for retaining the function of a device can be provided by the thermal spray depositing layer formed later, the undercoat layer can be made thin. Accordingly, the undercoat layer can be formed easily and inexpensively. Because the thermal spray depositing layer can be formed efficiently, the device can be produced inexpensively as a whole.

From the point of view of growing Group III nitride compound semiconductor with good crystallinity, Group III nitride compound semiconductor such as GaN, etc., ZnO or SiC may be also used as the undercoat layer.

The undercoat layer may be also made of a material represented by $(Ti_{1-x}A_x)N$, in which at least one kind of Group III element selected from the group consisting of aluminum (Al), gallium (Ga) and indium (In) can be selected as the metal A component of metal nitride $(Ti_{1-x}A_x)N$. Especially, Al is preferred because the difference in lattice constant is small.

At least one part of the Group III element may be replaced by boron (B), thallium (Tl), etc.

Electrically conducting characteristic can be given to the metal nitride $(Ti_{1-x}A_x)N$. In this case, electrodes can be formed on opposite surfaces of the semiconductor device, so that the number of device producing steps can be reduced to bring reduction in cost. Incidentally, when the composition x of metal A is selected to be in a range of from 0.01 to 0.6, required electrically conducting characteristic can be given to the metal nitride. The composition x of metal A is preferably in a range of from 0.1 to 0.6, more preferably in a range of from 0.2 to 0.6.

Such a metal nitride layer is low in lattice misfit to a Group III nitride compound semiconductor layer formed on the metal nitride layer compared with a metal nitride layer made of a binary compound such as TiN or the like. Accordingly, the crystallinity of the Group III nitride compound semiconductor layer can be improved.

Because the metal nitride layer of $(Ti_{1-x}A_x)N$ contains Ti as a component, the metal nitride layer can be formed with good crystallinity on the titanium layer while the titanium layer can be formed with good crystallinity on the substrate of sapphire or the like.

The method for producing the undercoat layer is not particularly limited but a method such as a DC sputtering method, an ion-plating method, a spray thermal decomposition method, an MOCVD method, an MBE method, a halide method, etc. can be used. Preferably, the undercoat layer is formed at a high temperature. This is because crystallinity is improved when the undercoat layer is grown at a high temperature.

For forming the metal nitride layer as the undercoat layer on the titanium layer, a sputtering method is particularly preferably used. This is because crystallinity of the metal nitride single crystal is improved.

The film thickness of the undercoat layer is not particularly limited either but maybe selected to be preferably in a range of from 0.1 $\mu$m to 10 $\mu$m, more preferably in a range of from 1 $\mu$m to 5 $\mu$m.

From the point of view of forming electrodes on opposite surfaces of the semiconductor device, it is preferable that the undercoat layer is electrically conductive.

In the case of a semiconductor light-emitting device, it is preferable that the undercoat layer has metallic gloss. This is for the purpose of efficiently reflecting light emitted from a light-emitting layer.

Thermal Spray Depositing Layer

The thermal spray depositing layer is formed on the undercoat layer. The material and film thickness of the thermal spray depositing layer are not particularly limited if the thermal spray depositing layer has characteristic of a substrate for a device.

According to the inventors' examination, TiN is preferably used as the material of the thermal spray depositing layer from the point of view of obtaining a crystallographic structure favorable to the undercoat layer. In this case, metal nitride of a rock salt structure, especially TiN, is preferably used as the undercoat layer.

TiN is electrically conductive. As a result, electrodes can be formed on opposite surfaces of the semiconductor device, so that the number of device producing steps can be reduced to bring reduction in cost.

Furthermore, TiN formed by gas tunnel type plasma reactive spray coating has metallic gloss, so that light emitted from the LED can be reflected efficiently to bring increase in luminance.

Furthermore, TiN is a flexible material compared with sapphire. Particularly TiN formed by spray coating is stratified finely. Accordingly, TiN also has a function of relaxing distortion (internal stress) caused by the difference in lattice constant or thermal expansion coefficient between the substrate and the Group III nitride compound semiconductor layer.

Characteristic (stiffness and impact resistance) for retaining the function of the device is required of the substrate. It is therefore preferable that the thickness of the thermal spray depositing layer is selected to be not smaller than 50 $\mu$m. More preferably, the thickness is selected to be not smaller than 100 $\mu$m. Incidentally, the thermal spray depositing layer can be made thin if stiffness can be retained.

Plasma reactive spray coating is preferably used as a spray coating method for TiN. For details, refer to Reprints of the National Meeting of Japan Welding Society, No. 65 (November, 1999), pp.410–411, and Quarterly Journal of Japan Welding Society, Vol.14, No.2, pp.443–448 (1996).

Separating Step

Any method can be selected as a method for separating the separator layer.

When, for example, a Ti layer is used as the separator layer, the separator layer can be etched with strong acid (such as hydrofluoric acid, aqua regia, or the like).

Formation of Group III Nitride Compound Semiconductor Layers

Each Group III nitride compound semiconductor is represented by the general formula: $Al_xGa_yIn_{1-x-y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ (0<x<1 in the above). At least one part of the Group III elements maybe replaced by boron (B), thallium (Tl), etc. At least one part of the nitrogen (N) may be replaced by phosphorus (P), arsenic (As), antimony (Sb), bismuth (Bi), etc. The Group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities.

Incidentally, after doped with p-type impurities, the group III nitride compound semiconductor may be subjected to electron beam irradiation or plasma irradiation or to heating in a furnace but not essentially. A method for forming each Group III nitride compound semiconductor layer is not particularly limited. The Group III nitride compound semiconductor layer may be formed by a metal organic chemical vapor deposition method (MOCVD method) or by a known method such as a molecular beam epitaxy method (MBE method), a halide vapor-phase epitaxy method (HVPE method), a sputtering method, anion-plating method, an electron showering method, etc.

An ELO (Epitaxial Lateral Overgrowth) method may be also used for improving the crystallinity of the Group III nitride compound semiconductor layer (see Unexamined Japanese Patent Publication No. Hei-10-312971).

Incidentally, a homo structure, a single hetero structure or a double hetero structure may be used as the structure of the light-emitting device. A quantum well structure (single quantum well structure or multiple quantum well structure) may be also used.

A buffer layer may be formed between the undercoat layer and the Group III nitride compound semiconductor layer (of a second Group III nitride compound semiconductor) forming a device functional portion. The buffer layer is made of a first Group III nitride compound semiconductor. Examples of the first Group III nitride compound semiconductor include: quaternary compound semiconductors represented by $Al_xGa_yIn_{1-x-y}N$ (0<X<1, 0<Y<1, 0<X+Y<1); ternary compound semiconductors represented by $Al_xGa_{1-x}N$ (0<X<1); and AlN, GaN and InN.

In the MOCVD method, the first Group III nitride compound semiconductor layer (buffer layer) of AlN, GaN, or the like, is formed directly on a substrate of sapphire or the like at a temperature of not higher than 600° C., for example, at a low temperature of about 400° C. However, when the first Group III nitride compound semiconductor layer is to be formed on the metal nitride layer as the undercoat layer, the semiconductor layer is grown at a high temperature of about 1000° C. to obtain a preferred crystal. Accordingly, the crystallinity of the second Group III nitride compound semiconductor layer formed on the buffer layer good in crystallinity is also improved.

The temperature of about 1000° C. is substantially equal to the growth temperature of the second Group III nitride compound semiconductor layer (device function-forming layer) formed on the first Group III nitride compound semiconductor layer (buffer layer). Accordingly, the growth temperature at the time of forming the first Group III nitride compound semiconductor by the MOCVD method is selected to be preferably in a range of from 600° C. to 1200° C., more preferably in a range of from 800° C. to 1200° C.

When the growth temperature of the first Group III nitride compound semiconductor layer (buffer layer) is equal to that of the second Group III nitride compound semiconductor (device function-forming layer) as described above, the temperature can be easily controlled at the time of execution of the MOCVD method.

Also when the buffer layer of the first Group III nitride compound semiconductor layer is formed on the undercoat layer by a sputtering method, there can be obtained a buffer layer having preferable crystallinity equal to or superior to that in the case where the buffer layer is formed by the MOCVD method (growth temperature: 1000° C.). Accordingly, the crystallinity of the second Group III nitride compound semiconductor layer formed on the first Group III nitride compound semiconductor layer is also improved.

Furthermore, for forming the first Group III nitride compound semiconductor layer (buffer layer) by the sputtering method, expensive organic metal such as TMA, TMI, etc. need not be used as a raw material compared with the MOCVD method. Accordingly, the device can be formed inexpensively. For the above description, refer to Unexamined Japanese Patent Publication No. 2000-323753.

EMBODIMENTS

Embodiments of the invention will be described below.

First Embodiment

First, as shown in FIG. 1A, a Ti layer (1 μm) as a separator layer 2 is formed on a sapphire substrate (300 μm) as an auxiliary substrate 1 at a temperature of 450° C. (substrate temperature) by reactive DC magnetron sputtering. Then, a TiN layer (3 μm) as an undercoat layer 3 is formed at a temperature of 450° C. by reactive DC magnetron sputtering in the same manner as described above.

Then, a TiN thermal spray depositing layer 4 is formed by gas tunnel type plasma reactive spray coating so that the TiN thermal spray depositing layer 4 is 300 μm thick. On this occasion, the substrate temperature is preferably selected to be not higher than 650° C. This because the crystallographic structure of Ti changes at a temperature of not lower than 700° C.

Figure 1B:
Figure 1B:
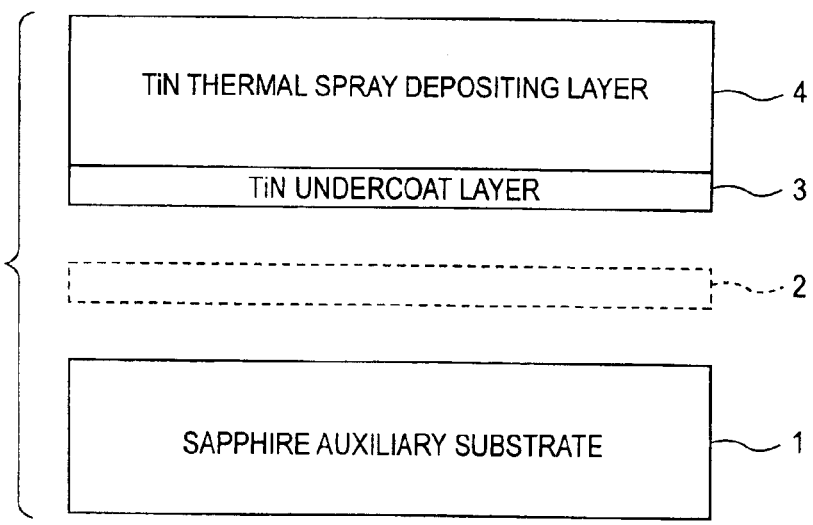

Then, the resulting substrate is immersed in hydrofluoric acid at 25° C. for about 100 hours so that the Ti separator layer 2 is dissolved as shown in FIG. 1B.

Figure 2:
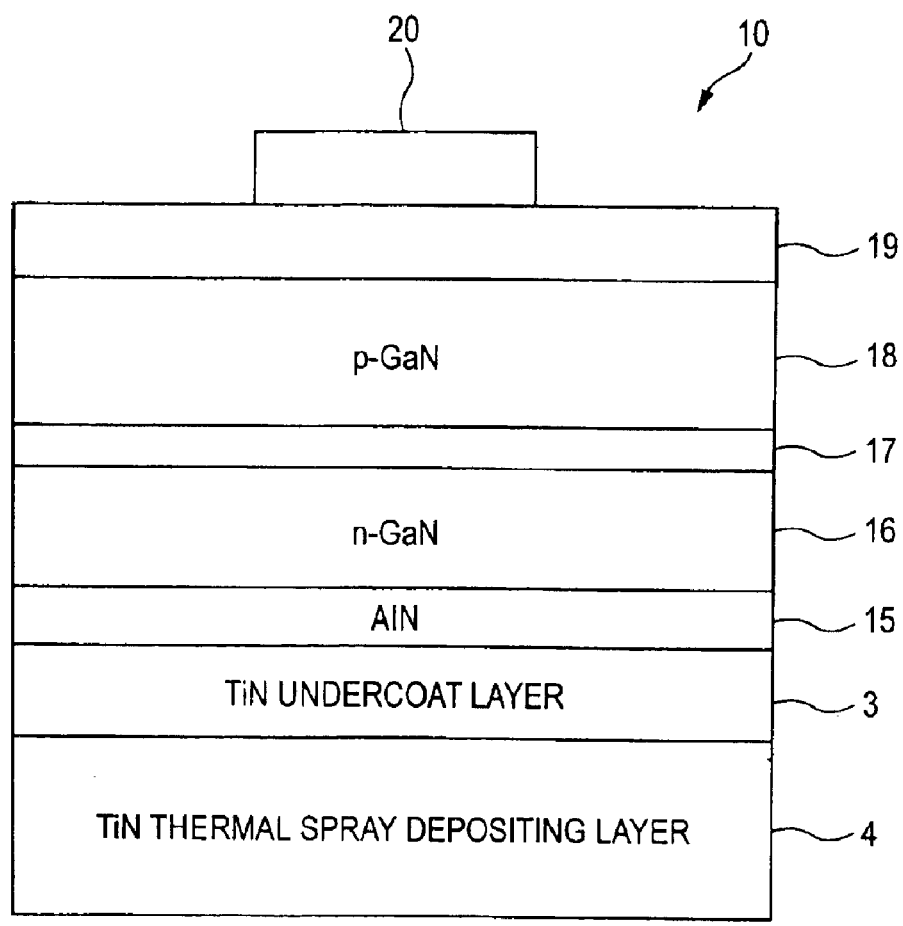
FIG. 2 is a view showing the configuration of a light-emitting diode according to an embodiment of the invention.

Then, the thermal spray depositing layer 4 and the undercoat layer 3 are used as a substrate so that a light-emitting diode 10 shown in FIG. 2 is formed by an ordinary method.

Specifications of respective layers are as follows.

| Layer | Composition |
|---|---|
| p-type layer 18 | p-GaN:Mg |
| Layer 17 containing a light-emitting layer | containing InGaN |
| n-type layer 16 | n-GaN:Si |
| Buffer layer 15 | AlN |
| Undercoat layer 3 | TiN |
| Thermal spray depositing layer 4 | TiN |

Although the case where the n-type layer is made of GaN is shown here, AlGaN, InGaN or AlInGaN may be used.

Although the n-type layer is doped with Si as n-type impurities, Ge, Se, Te, C, etc. may be used as other n-type impurities.

The n-type layer 16 may be of a double-layered structure having an n− layer of low electron density on the 17 side and an n+ layer of high electron density on the buffer layer 15 side.

The layer 17 containing a light-emitting layer may contain a light-emitting layer of a quantum well structure. A single hetero type structure, a double hetero type structure or a homo-junction type structure may be used as the structure of the light-emitting device.

The layer 17 containing a light-emitting layer may contain a Group III nitride compound semiconductor layer disposed on the p-type layer 18 side, doped with an acceptor such as magnesium or the like and having a wide band gap. This is provided for effectively preventing electrons injected into the layer 17 containing a light-emitting layer from diffusing into the p-type layer 18.

A p-type layer 18 of GaN doped with Mg as p-type impurities is formed on the layer 17 containing a light-emitting layer. Alternatively, the p-type layer may be made of AlGaN, InGaN or InAlGaN. Zn, Be, Ca, Sr or Ba may be used as p-type impurities.

Further, the p-type layer 18 may be of a double-layered structure having a p– layer of low hole density on the layer 17 containing a light-emitting layer side and a p+ layer of high hole density on the electrode side.

In the light-emitting diode configured as described above, each Group III nitride compound semiconductor layer may be formed by execution of MOCVD in a general condition. In the growth method, an ammonia gas and gases of Group III element alkyl compounds such as trimethyl gallium (TMG), trimethyl aluminum (TMA) and trimethyl indium (TMI) are supplied onto a substrate heated to a suitable temperature to bring a thermal decomposition reaction to thereby grow a desired crystal on the substrate.

The crystallinity of each of the Group III nitride compound semiconductor layers 16 to 18 formed in this manner is preferable.

Alternatively, each Group III nitride compound semiconductor layer may be formed by a method such as a molecular beam epitaxy method (MBE method), a halide vapor-phase epitaxy method (HVPE method), a sputtering method, anion-plating method, an electron showering method, etc.

A light-transmissive electrode 19 is made of a thin film containing gold. The light-transmissive electrode 19 is laminated on the p-type layer 18 so that the substantially whole upper surface of the p-type layer 18 is covered with the light-transmissive electrode 19. A p-electrode 20 is also made of a material containing gold. The p-electrode 20 is formed on the light-transmissive electrode 19 by vapor deposition.

Incidentally, the AlN buffer layer 15 may be formed by an MOCVD method or may be formed by a sputtering method.

Second Embodiment

Figure 3:
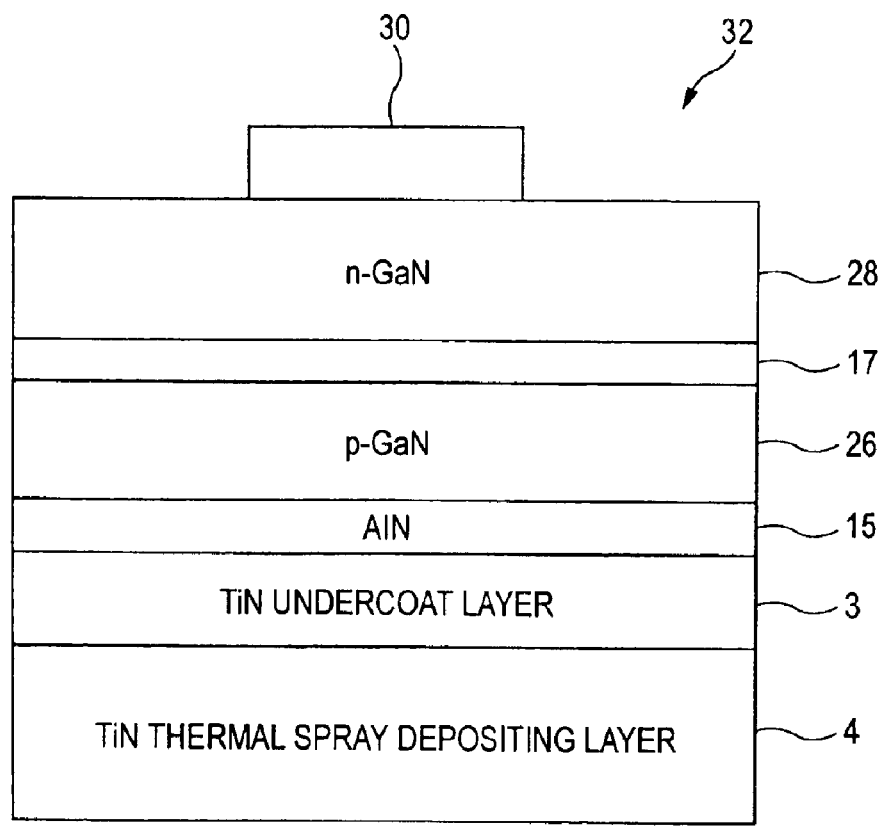
FIG. 3 is a view showing the configuration of a light-emitting diode according to another embodiment of the invention.

FIG. 3 shows a semiconductor device according to a second embodiment of the invention. The semiconductor device according to this embodiment is a light-emitting diode 32. Incidentally, parts the same as those in FIG. 2 are denoted by the same reference numerals as those in FIG. 2 for the sake of omission of description.

Specifications of respective layers are as follows.

| Layer | Composition |
|---|---|
| n-type layer 28 | n-GaN:Si |
| Layer 17 containing a light-emitting layer | containing InGaN |
| p-type layer 26 | p-GaN:Mg |
| Buffer layer 15 | AlN |
| Undercoat layer 3 | TiN |
| Thermal spray depositing layer 4 | TiN |

As shown in FIG. 3, the p-type layer 26, the layer 17 containing a light-emitting layer and the n-type layer 28 are grown successively on the buffer layer 15 to form a light-emitting diode 32. In the case of the device 32, the light-transmissive electrode (see the reference numeral 19 in FIG. 2) can be dispensed with because the n-type layer 28 low in resistance value forms the uppermost surface.

In the drawing, the reference numeral 30 designates an n-electrode. The thermal spray depositing layer 4 can be used as a p-electrode as it is. Incidentally, the AlN buffer layer 15 may be formed by an MOCVD method or may not.

Although the invention has been described in detail and with reference to specific embodiments, it is obvious to those skilled in the art that various changes or modifications may be made without departing from the spirit and scope of the invention.

This application is based on a Japanese Patent application (Japanese Patent Application No. 2001-170910) filed on Jun. 6, 2001, the contents of which are incorporated herein by reference.

INDUSTRIAL APPLICABILITY

The device to which the invention is applied is not limited to the aforementioned light-emitting diode. The invention can be also applied to optical devices such as a laser diode, a solar cell, etc.; bipolar devices such as a rectifier, a thyristor, a transistor, etc.; unipolar devices such as an FET, etc.; and electronic devices such as a microwave device, etc.

The invention may be further applied to laminates which are intermediates of these devices.

The invention is not limited to the description of Mode for Carrying Out the Invention and Embodiments at all. Various modifications that can be conceived by those skilled in the art may be contained in the invention without departing from the scope of claim.

The following items are disclosed.

A separator layer may be formed by spray coating (material: Ti, ZnO, or the like).

A thermal spray depositing layer may be formed on Ti or ZnO as the separator layer without interposition of any undercoat layer. In this case, semiconductor layers are laminated onto the thermal spray depositing layer after separation of the separator layer.

An undercoat layer made of Group III nitride compound semiconductor can be formed by an MOCVD method.

As the material of the thermal spray depositing layer, $TiO_2$ may be used instead of TiN. TiN and/or ZnO can be mixed with the $TiO_2$. Furthermore, the thermal spray depositing layer may be formed multistageously. For example, TiN is sprayed again on TiN which has been sprayed thinly and heated precedingly. By the heat treatment, the crystallographic structure of the undercoat layer is improved.

The following items are further disclosed.

21. A method of producing a laminate, including the steps of:
    forming a separator layer on an auxiliary substrate;
    forming an undercoat layer on the separator layer;
    forming a thermal spray depositing layer on the undercoat layer;
    separating the separator layer from the undercoat layer; and
    forming a Group III nitride compound semiconductor layer on the undercoat layer.

22. A method of producing a laminate according to the paragraph 21, wherein: the separator layer is made of titanium; in the step of forming the undercoat layer, nitride of one kind of metal or two or more kinds of metal selected from the group consisting of titanium, hafnium, zirconium and tantalum is sputtered on the separator layer to form the undercoat layer; and in the step of forming the thermal spray depositing layer, titanium nitride is plasma-reactively sprayed on the undercoat layer to form the thermal spray depositing layer.

23. A method of producing a laminate according to the paragraph 22, wherein the undercoat layer is made of titanium nitride.

24. A method of producing a laminate according to the paragraph 22, wherein the undercoat layer is made of either of Group III nitride compound semiconductor and silicon carbide.

25. A method of producing a laminate according to any one of the paragraphs 22, 23 and 24, wherein the thermal spray depositing layer has a film thickness of not smaller than 50 μm.

26. A method of producing a laminate according to any one of the paragraphs 21 through 25, wherein the auxiliary substrate is made of one member selected from the group consisting of sapphire, silicon carbide, gallium nitride, silicon, gallium phosphide, and gallium arsenide.

27. A method of producing a laminate according to any one of the paragraphs 21 through 26, wherein the Group III nitride compound semiconductor device is either of a light-emitting device and a photoreceptor.

31. A laminate comprising a substrate formed by spray coating, an undercoat layer formed on the substrate, and a Group III nitride compound semiconductor layer epitaxially grown on the undercoat layer.

32. A laminate according to the paragraph 31, wherein: the undercoat layer is made of nitride of one kind of metal or two or more kinds of metal selected from the group consisting of titanium, hafnium, zirconium and tantalum or made of either of Group III nitride compound semiconductor and silicon carbide; and the substrate is made of titanium nitride.

33. A laminate according to the paragraph 31, wherein: the undercoat layer is made of titanium nitride; and the substrate is made of titanium nitride.

34. A laminate according to any one of the paragraphs 31 through 33, wherein the Group III nitride compound semiconductor layer has either of a light-emitting device structure and a photoreceptor structure.

What is claimed is:

1. A method of producing a Group III nitride compound semiconductor device, comprising steps of:

forming a separator layer on an auxiliary substrate;

forming an undercoat layer on said separator layer;

forming a thermal spray depositing layer on said undercoat layer;

separating said separator layer from said undercoat layer; and forming a Group III nitride compound semiconductor layer on a surface of said undercoat layer opposite to a surface on which said thermal spray depositing layer is formed.

2. A method of producing a Group III nitride compound semiconductor device according to claim 1, wherein: said separator layer is made of titanium; in the step of forming said undercoat layer, nitride of at least one metal selected from the group consisting of titanium, hafnium, zirconium and tantalum is sputtered on said separator layer to form said undercoat layer; and in the step of forming said thermal spray depositing layer, titanium nitride is plasma-reactively sprayed on said undercoat layer to form said thermal spray depositing layer.

3. A method of producing a Group III nitride compound semiconductor device according to claim 2, wherein said undercoat layer is made of titanium nitride.

4. A method of producing a Group III nitride compound semiconductor device according to claim 1, wherein said undercoat layer is made of one of Group III nitride compound semiconductor and silicon carbide.

5. A method of producing a Group III nitride compound semiconductor device according to claim 2, wherein said thermal spray depositing layer has a film thickness of not smaller than 50 μm.

6. A method of producing a Group III nitride compound semiconductor device according to claim 1, wherein said auxiliary substrate is made of one member selected from the group consisting of sapphire, silicon carbide, galliumnitride, silicon, gallium phosphide, and gallium arsenide.

7. A method of producing a Group III nitride compound semiconductor device according to claim 1, wherein said Group III nitride compound semiconductor device is one of a light-emitting device and a photoreceptor.

8. A Group III nitride compound semiconductor device comprising a substrate formed by spray coating, an undercoat layer formed on said substrate, and a Group III nitride compound semiconductor layer epitaxially grown on said undercoat layer.

9. A Group III nitride compound semiconductor device according to claim 8, wherein: said undercoat layer is made of nitride of at least one metal selected from the group consisting of titanium, hafnium, zirconium and tantalum or made of either of Group III nitride compound semiconductor and silicon carbide; and said substrate is made of titanium nitride.

10. A Group III nitride compound semiconductor device according to claim 8, wherein: said undercoat layer is made of titanium nitride; and said substrate is made of titanium nitride.

11. A Group III nitride compound semiconductor device according to claim 8, wherein said Group III nitride compound semiconductor layer has one of a light-emitting device structure and a photoreceptor structure.

* * * * *